US008723765B2

(12) United States Patent
Kang et al.

(10) Patent No.: US 8,723,765 B2
(45) Date of Patent: May 13, 2014

(54) STAGE CIRCUIT AND SCAN DRIVER USING THE SAME

(75) Inventors: Chul-Kyu Kang, Yongin (KR); Seong-Il Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 392 days.

(21) Appl. No.: 13/249,137

(22) Filed: Sep. 29, 2011

(65) Prior Publication Data

US 2013/0002615 A1 Jan. 3, 2013

(30) Foreign Application Priority Data

Jun. 30, 2011 (KR) ........................ 10-2011-0064438

(51) Int. Cl.
*G09G 3/32* (2006.01)
*G09G 3/36* (2006.01)
*G11C 19/00* (2006.01)

(52) U.S. Cl.
USPC ................................ 345/82; 377/64; 345/100

(58) Field of Classification Search
USPC ........ 345/76–83, 100; 327/64–81; 377/64–81
See application file for complete search history.

(56) References Cited

U.S. PATENT DOCUMENTS

2008/0062097 A1* 3/2008 Jeong et al. ..................... 345/84
2009/0251443 A1* 10/2009 Jinta ............................. 345/204
2010/0177023 A1* 7/2010 Han ............................... 345/76
2011/0193855 A1* 8/2011 Han .............................. 345/214
2012/0050234 A1* 3/2012 Jang et al. ..................... 345/204

FOREIGN PATENT DOCUMENTS

KR 1020050037657 A 4/2005
KR 1020070002784 A 1/2007

* cited by examiner

*Primary Examiner* — Bipin Shalwala
*Assistant Examiner* — Steven Holton
(74) *Attorney, Agent, or Firm* — Christie, Parker & Hale, LLP

(57) ABSTRACT

A stage circuit includes a progressive driver and a concurrent driver, and a scan driver includes a plurality of stage circuits that are capable of supplying a scan signal to scan lines progressively and concurrently (e.g., simultaneously).

20 Claims, 5 Drawing Sheets

STAGE CIRCUIT AND SCAN DRIVER USING THE SAME

CROSS-REFERENCE TO RELATED APPLICATION

This application claims priority to and the benefit of Korean Patent Application No. 10-2011-0064438, filed on Jun. 30, 2011, in the Korean Intellectual Property Office, the entire content of which is incorporated herein by reference.

BACKGROUND

1. Field

Aspects of embodiments according to the present invention relate to a stage circuit and a scan driver using the same.

2. Description of Related Art

Flat panel display devices have been developed with reduced weight and volume in comparison to cathode ray tubes. The flat panel display devices include a liquid crystal display, a field emission display, a plasma display panel, an organic light emitting display, and the like.

Among these flat panel display devices, the organic light emitting display displays images using organic light emitting diodes that emit light through recombination of electrons and holes. The organic light emitting display has a fast response speed and is driven with low power consumption.

Generally, organic light emitting displays are classified into a passive matrix organic light emitting display (PMOLED) and an active matrix organic light emitting display (AMOLED), depending on a method of driving organic light emitting diodes.

The AMOLED includes a plurality of scan lines, a plurality of data lines, a plurality of power lines, and a plurality of pixels connected to these lines and arranged in a matrix form. Each of the pixels generally includes an organic light emitting diode, a driving transistor for controlling the amount of current supplied to the organic light emitting diode, a switching transistor for transmitting a data signal to the driving transistor, and a storage capacitor for maintaining the voltage of the data signal.

The driving method of the organic light emitting display is divided into a progressive emission method and a concurrent (e.g., simultaneous) emission method. The progressive emission method refers to a method in which data is progressively inputted for each scan line, and pixels on each horizontal line are progressively emitted in the same order as the data is inputted.

The concurrent emission method refers to a method in which data is progressively inputted for each scan line, and pixels are concurrently (e.g., simultaneously) emitted after the data is inputted to all the pixels. In order to implement the concurrent emission method, a scan signal is concurrently (e.g., simultaneously) or progressively supplied to the scan lines.

SUMMARY

Aspects of embodiments according to the present invention are directed toward a stage circuit and a scan driver using the same capable of concurrently (e.g., simultaneously) or progressively supplying a scan signal to scan lines.

According to an embodiment of the present invention, there is provided a stage circuit including a progressive driver including a first transistor coupled between a second input terminal and an output terminal of the stage circuit, a gate electrode of the first transistor being coupled to a first node; a third transistor coupled between the first node and a fifth input terminal of the stage circuit, a gate electrode of the third transistor being coupled to a first input terminal of the stage circuit; a fourth transistor coupled between a second node and a voltage supply terminal, a gate electrode of the fourth transistor being coupled to the fifth input terminal; a fifth transistor coupled between the first node and a second power source, a gate electrode of the fifth transistor being coupled to the second node; and a sixth transistor coupled between a first power source and the second node, a gate electrode of the sixth transistor being coupled to a third input terminal of the stage circuit; and a concurrent driver including a second transistor coupled between the output terminal and a fourth input terminal of the stage circuit, a gate electrode of the second transistor being coupled to the second node.

The stage circuit may further include a first capacitor coupled between the first node and the output terminal; and a second capacitor coupled between the second node and the fourth input terminal. The voltage supply terminal may be coupled to the fourth input terminal.

The voltage supply terminal may be coupled to the second power source. The stage circuit may further include a seventh transistor coupled between the second power source and the fourth transistor, a gate electrode of the seventh transistor being coupled to the first input terminal. Clock signals having different phases may be supplied to the first, second, and third input terminals, respectively. A start signal or an output signal of a previous stage circuit may be supplied to the fifth input terminal in synchronization with the clock signal supplied to the first input terminal.

The clock signals may be supplied to the respective first to third input terminals at least once, and a common clock signal may be then supplied to the fourth input terminal during a period in which a scan signal is supplied in the concurrent driver. The first power source may be set to a voltage at which the first to seventh transistors are turned on, and the second power source may be set to a voltage at which the first to seventh transistors are turned off.

According to an embodiment of the present invention, there is provided a scan driver including stage circuits respectively coupled to scan lines for supplying a scan signal to the scan lines, wherein a stage circuit of the stage circuits includes a progressive driver including a first transistor coupled between a second input terminal and an output terminal of the stage circuit, a gate electrode of the stage circuit being coupled to a first node; a third transistor coupled between the first node and a fifth input terminal of the stage circuit, a gate electrode of the third transistor being coupled to a first input terminal of the stage circuit; a fourth transistor coupled between a second node and a voltage supply terminal, a gate electrode of the fourth transistor being coupled to the fifth input terminal; a fifth transistor coupled between the first node and a second power source, a gate electrode of the fifth transistor being coupled to the second node; and a sixth transistor coupled between a first power source and the second node, a gate electrode of the sixth transistor being coupled to a third input terminal of the stage circuit; and a concurrent driver including a second transistor coupled between the output terminal and a fourth input terminal of the stage circuit, a gate electrode of the second transistor being coupled to the second node.

First, second, and third clock signals may be respectively supplied to the first, second, and third input terminals included in an i-th stage circuit (where i is 1, 4, 7, . . . ) of the stage circuits; the second, third, and first clock signals may be respectively supplied to the first, second, and third input terminals included in an (i+1)-th stage circuit of the stage circuits; and the third, first, and second clock signals may be respectively supplied to the first, second, and third input terminals included in an (i+2)-th stage circuit of the stage circuits.

A common clock signal may be supplied to the fourth terminals included in the i-th, (i+1)-th, and (i+2)-th stage circuits. The clock signals may be supplied to the respective first to third input terminals at least once, and a common clock signal may be then supplied to the fourth input terminal during a period in which a scan signal is supplied in the concurrent driver.

According to the embodiments of the present invention, the stage circuit and the scan driver using the same can progressively or concurrently (e.g., simultaneously) supply a scan signal to scan lines. Further, the stage circuit can be implemented into a simple structure including seven transistors and two capacitors.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION OF THE EMBODIMENTS

Figure 1:
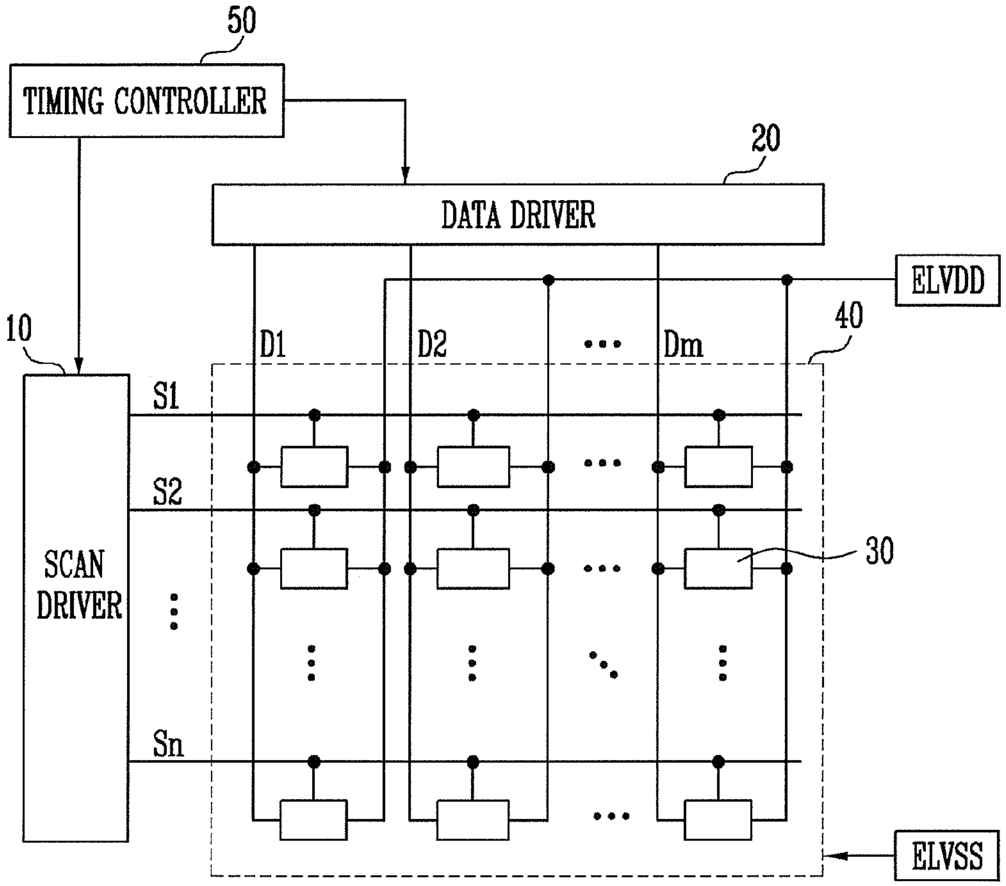
FIG. 1 is a block diagram showing an organic light emitting display according to an embodiment of the present invention.

Hereinafter, certain exemplary embodiments according to the present invention will be described with reference to the accompanying drawings. Here, when a first element is described as being coupled to a second element, the first element may be directly coupled to the second element or indirectly coupled to the second element via one or more third elements. Further, some of the elements that are not essential to the complete understanding of the invention are omitted for clarity. Also, like reference numerals refer to like elements throughout.

FIG. 1 is a block diagram showing an organic light emitting display according to an embodiment of the present invention.

Referring to FIG. 1, the organic light emitting display according to this embodiment includes a display unit 40 having pixels 30 positioned at crossing portions of scan lines S1 to Sn and data lines D1 to Dm; a scan driver 10 for driving the scan lines S1 to Sn; a data driver 20 for driving the data lines D1 to Dm; and a timing controller 50 for controlling the scan driver 10 and the data driver 20.

The scan driver 10 supplies a scan signal to the scan lines S1 to Sn. When the scan signal is supplied to the scan lines S1 to Sn, pixels 30 are selected. Here, the scan driver 10 concurrently (e.g., simultaneously) or progressively supplies the scan signal to the scan lines S1 to Sn, corresponding to a driving method.

The data driver 20 supplies a data signal to the data lines D1 to Dm in synchronization with the scan signal. Here, the data signal is supplied in synchronization with the progressively supplied scan signal.

The timing controller 50 supplies a control signal for controlling the scan driver 10 and the data driver 20. The timing controller 50 supplies data supplied from the outside thereof to the data driver 20.

Each of the pixels 30 stores a voltage corresponding to the data signal, and generates light with a set or predetermined luminance while supplying current corresponding to the stored voltage to an organic light emitting diode (not shown).

Figure 2:
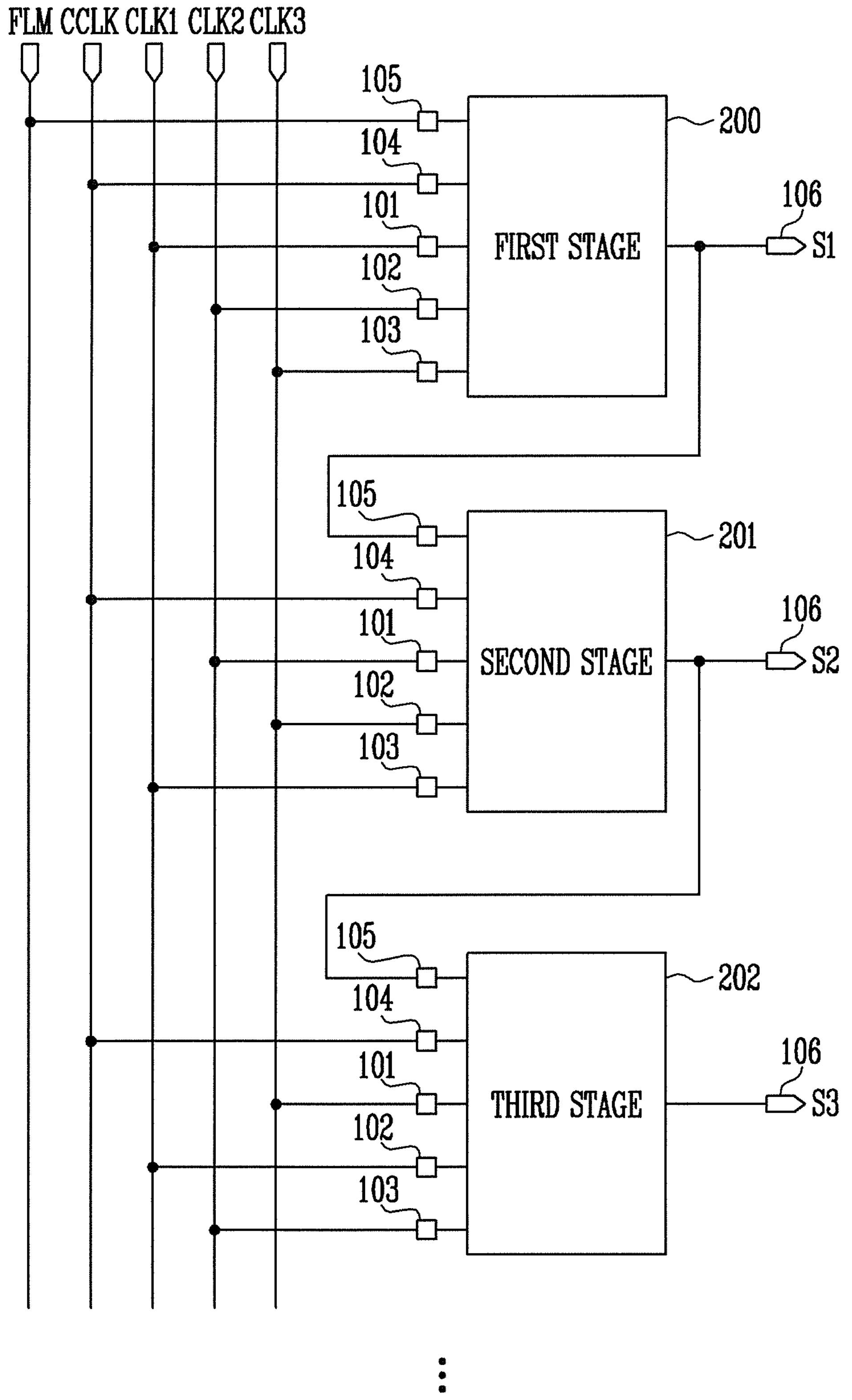
FIG. 2 is a block diagram showing stages in a scan driver shown in FIG. 1.

FIG. 2 is a block diagram showing stages in a scan driver shown in FIG. 1. For convenience of illustration, three stages are shown in FIG. 2.

Referring to FIG. 2, the scan driver 10 according to this embodiment includes stages 200, 201, and 202 that are respectively coupled to scan lines S1 to S3. Each of the stages 200, 201, and 202 is coupled to a corresponding one of the scan lines S1 to S3. Each of the stages 200, 201, and 202 is driven by three clock signals CLK1 to CLK3 and a common clock signal CCLK.

Each of the stages 200, 201, and 202 includes a first input terminal 101, a second input terminal 102, a third input terminal 103, a fourth input terminal 104, a fifth input terminal 105, and an output terminal 106.

The first, second, and third input terminals 101, 102, and 103 included in an i-th stage (where i is 1, 4, 7, . . . ) receive the first, second, and third clock signals CLK1, CLK2, and CLK3, respectively. The first, second, and third input terminals 101, 102, and 103 included in an (i+1)-th stage receive the second, third, and first clock signals CLK2, CLK3, and CLK1, respectively. The first, second, and third input terminals 101, 102, and 103 included in an (i+2)-th stage receive the third, first, and second clock signals CLK3, CLK1, and CLK2, respectively.

The fourth input terminal 104 included in each of the stages 200 to 202 receives the common clock signal CCLK, and the fifth input terminal 105 included in each of the stages 200 to 202 receives a start signal FLM or an output signal of the previous stage. Practically, the fifth input terminal 105 of the first stage 200 receives the start signal FLM, and the other stages 201 and 202 receive the output signal of the previous stage. The stages 200 to 202 are configured to have the same circuit configuration, and concurrently (e.g., simultaneously) or progressively output a scan signal.

Figure 3:
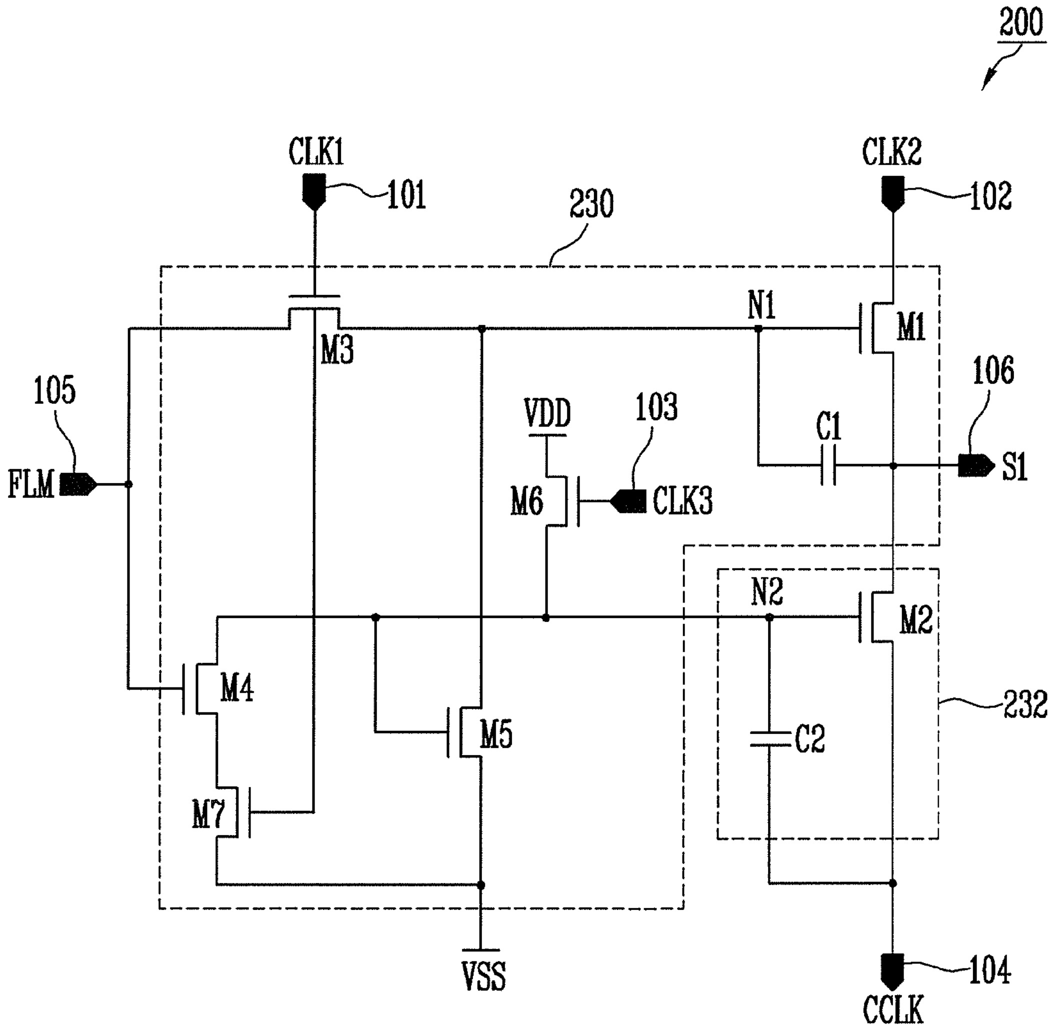
FIG. 3 is a circuit diagram schematically showing an embodiment of the stage shown in FIG. 2.

FIG. 3 is a circuit diagram showing an embodiment of the stage shown in FIG. 2. For convenience of illustration, the stage 200 is shown in FIG. 3.

Referring to FIG. 3, the stage 200 according to this embodiment includes a progressive driver 230 and a concurrent driver 232.

The progressive driver 230 outputs a scan signal, corresponding to the first clock signal CLK1, the second clock signal CLK2, the third clock signal CLK3, and the start signal FLM (or the output signal of the previous stage). The progressive driver 230 is used to progressively supply the scan signal to the scan lines S1 to Sn. To this end, the progressive driver 230 includes a first transistor M1, three to seventh transistors M3 to M7, and a first capacitor C1.

The first transistor M1 is coupled between the second input terminal 102 and the output terminal 106. A gate electrode of the first transistor M1 is coupled to a first node N1. The first transistor M1 is turned on or off, corresponding to a voltage applied to the first node N1. When the first transistor M1 is turned on, the second input terminal 102 is electrically coupled to the output terminal 106.

The third transistor M3 is coupled between the first node N1 and the fifth input terminal 105. A gate electrode of the third transistor M3 is coupled to the first input terminal 101. The third transistor M3 is turned on or off, corresponding to the first clock signal CLK1 supplied to the first input terminal 101. When the third transistor M3 is turned on, the fifth input terminal 105 is electrically coupled to the first node N1.

The fourth transistor M4 is coupled between a second node N2 and a second power source VSS. A gate electrode of the fourth transistor M4 is coupled to the fifth input terminal 105. The fourth transistor M4 is turned on or off, corresponding to the start signal FLM (or the output signal of the previous stage) supplied to the fifth input terminal 105. When the fourth transistor M4 is turned on, the second node N2 is coupled to the second power source VSS via the seventh transistor M7 (when the seventh transistor is turned on).

The fifth transistor M5 is coupled between the first node and the second power source VSS. A gate electrode of the fifth transistor M5 is coupled to the second node N2. The fifth transistor M5 is turned on or off, corresponding to a voltage at the second node N2. When the fifth transistor M5 is turned on, the voltage of the second power source VSS is supplied to the first node N1.

The sixth transistor M6 is coupled between a first power source VDD and the second node N2. A gate electrode of the sixth transistor M6 is coupled to the third input terminal 103. The sixth transistor M6 is turned on or off, corresponding to the third clock signal CLK3 supplied to the third input terminal 103. When the sixth transistor M6 is turned on, the voltage of the first power source VDD is supplied to the second node N2.

Here, the first power source VDD is set to have a high voltage that is higher than that of the second power source VSS. For example, the first power source VDD is set to a voltage at which the transistors M1 to M7 can be turned on, and the second power source VSS is set to a voltage at which the transistors M1 to M7 can be turned off.

The seventh transistor M7 is coupled between the fourth transistor M4 and the second power source VSS. A gate electrode of the seventh transistor M7 is coupled to the first input terminal 101. The seventh transistor M7 is turned on or off, corresponding to the first clock signal CLK1 supplied to the first input terminal 101. When the seventh transistor M7 is turned on, the fourth transistor M4 is electrically coupled to the second power source VSS.

The first capacitor C1 is coupled between the first node N1 and the output terminal 106. The first capacitor C1 is charged with a voltage corresponding to the turned-on or turned-off state of the first transistor M1. The first capacitor C1 controls the voltage at the first node N1 corresponding to the voltage supplied to the output terminal 106, so that the first transistor M1 can stably maintain a turned-on state.

The concurrent driver 232 outputs a scan signal, corresponding to the common clock signal CCLK. The concurrent driver 232 is used to concurrently (e.g., simultaneously) supply the scan signal to the scan lines S1 to Sn. To this end, the concurrent driver 232 includes a second transistor M2 and a second capacitor C2.

The second transistor M2 is coupled between the output terminal 106 and the fourth input terminal 104. A gate electrode of the second transistor M2 is coupled to the second node N2. The second transistor M2 is turned on or off, corresponding to the voltage applied to the second node N2. When the second transistor M2 is turned on, the fourth input terminal 104 is electrically coupled to the output terminal 106.

The second capacitor C2 is coupled between the second node N2 and the fourth input terminal 104. The second capacitor C2 is charged with a voltage corresponding to the turned-on or turned-off state of the second transistor M2. The second capacitor C2 controls the voltage at the second node N2 corresponding to the voltage supplied to the fourth input terminal 104, so that the second transistor M2 can stably maintain a turned-on state.

Figure 4:
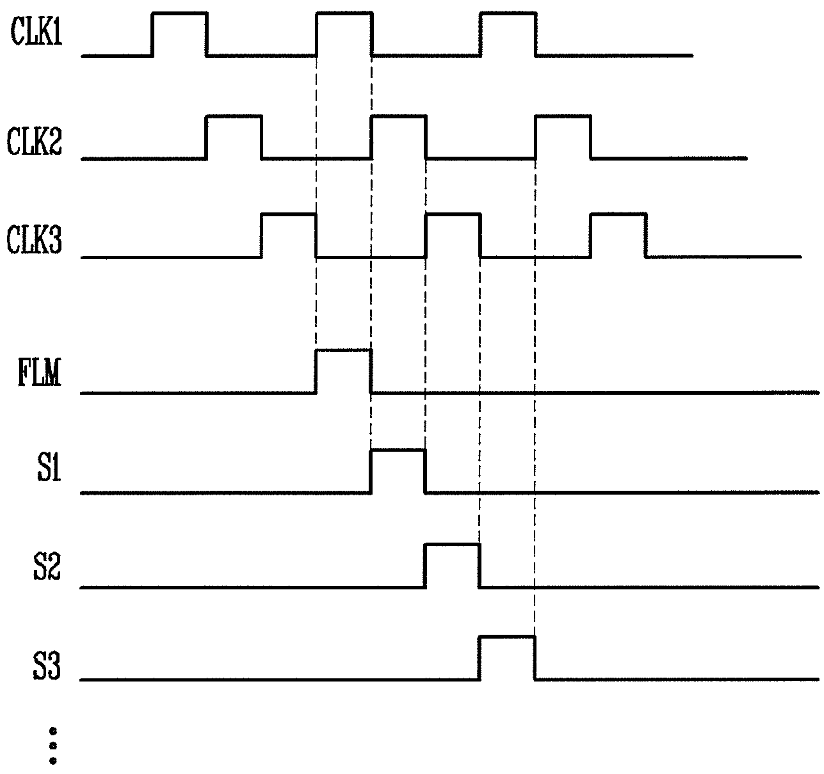
FIG. 4 is a waveform diagram illustrating a progressive driving method of the stage circuit shown in FIG. 3.

FIG. 4 is a waveform diagram illustrating a progressive driving method of the stage circuit shown in FIG. 3.

Referring to FIG. 4, the first, second, and third clock signals CLK1, CLK2, and CLK3 are progressively supplied so as not to overlap with one another (i.e., so that their phases are different from one another). The first to third clock signals CLK1 to CLK3 have high voltages so that the N-type transistors M1 to M7 can be turned on.

The operating process of the stage will be described in more detail. First, the first clock signal CLK1 is supplied to the first input terminal 101, and the start signal FLM is supplied to the fifth input terminal 105. When the first clock signal CLK1 is supplied to the first input terminal 101, the third and seventh transistors M3 and M7 are turned on.

When the third transistor M3 is turned on, the start signal FLM supplied to the fifth input terminal 105 is supplied to the first node N1. When the start signal FLM is supplied to the first node N1, the first transistor M1 is turned on. When the first transistor M1 is turned on, the second input terminal 102 is electrically coupled to the output terminal 106. In this instance, the second clock signal CLK2 is not supplied to the second input terminal 102, and hence a low voltage is supplied to the output terminal 106 (i.e., a scan signal is not supplied). Here, the first capacitor C1 is charged with a voltage corresponding to the turned-on state of the first transistor M1 during a period in which the first transistor M1 is turned on.

When the start signal FLM is supplied to the fifth input terminal 105, the fourth transistor M4 is turned on. In this instance, the seventh transistor M7 is also set to be in a turned-on state, and hence the voltage of the second power source VSS is supplied to the second node N2 via the seventh transistor M7 and the fourth transistor M4. When the voltage of the second power source VSS is supplied to the second node N2, the second transistor M2 is turned off. Here, the second capacitor C2 is charged with a voltage corresponding to the turned-off state of the second transistor M2 during a period in which the second transistor M2 is turned off.

Then, the second clock signal CLK2 is supplied to the second input terminal 102. In this instance, the first transistor M1 is set to be in a turned-on state corresponding to the voltage stored in the first capacitor C1, and hence the second clock signal CLK2 is supplied to the output terminal 106. The second clock signal CLK2 supplied to the output terminal 106 is supplied as a scan signal to the scan line S1. Here, when the second clock signal CLK2 is supplied to the output terminal 106, the voltage at the first node N1 is increased by the coupling of the first capacitor C1, and accordingly, the first transistor M1 can stably maintain a turned-on state.

After the scan signal is supplied to the output terminal 106, the third clock signal CLK3 is supplied to the third input terminal 103. When the third clock signal CLK3 is supplied to the third input terminal 103, the sixth transistor M6 is turned on. When the sixth transistor M6 is turned on, the voltage of the first power source VDD is supplied to the second node N2, and accordingly, the second transistor M2 is turned on. When the second transistor M2 is turned on, the output terminal 106 is electrically coupled to the fourth input terminal 104. In this instance, the common clock signal CCLK is not supplied to the fourth input terminal 104, and hence a low voltage, i.e., a scan signal, is not supplied to the output terminal 106.

Then, the first clock signal CLK1 is supplied so that the third transistor M3 is turned on. When the third transistor M3 is turned on, the fifth input terminal 105 is electrically coupled to the first node N1. In this instance, the start signal FLM is not supplied to the fifth input terminal 105, and accordingly, a low voltage is supplied to the first node N1. When the low voltage is supplied to the first node N1, the first transistor M1 is turned off.

Then, in the stage 200, the first and second transistors M1 and M2 respectively maintain turned-off and turned-on states until before the next start signal FLM is supplied. In this case, a low voltage is supplied to the output terminal 106.

Here, the second stage 201 receives an output signal of the first stage 200 in synchronization with the second clock signal CLK2. Accordingly, the second stage 201 outputs a scan signal to the scan line S2 in synchronization with the third clock signal CLK3. Similarly, the third stage 202 receives an output signal of the second stage 201 in synchronization with the third clock signal CLK3. Accordingly, the third stage 202 outputs a scan signal to the scan line S3 in synchronization with the first clock signal CLK1. The i-th, (i+1)-th, and (i+2)-th stages progressively output the scan signal to the scan lines S1 to Sn by repeating the process described above.

Figure 5:
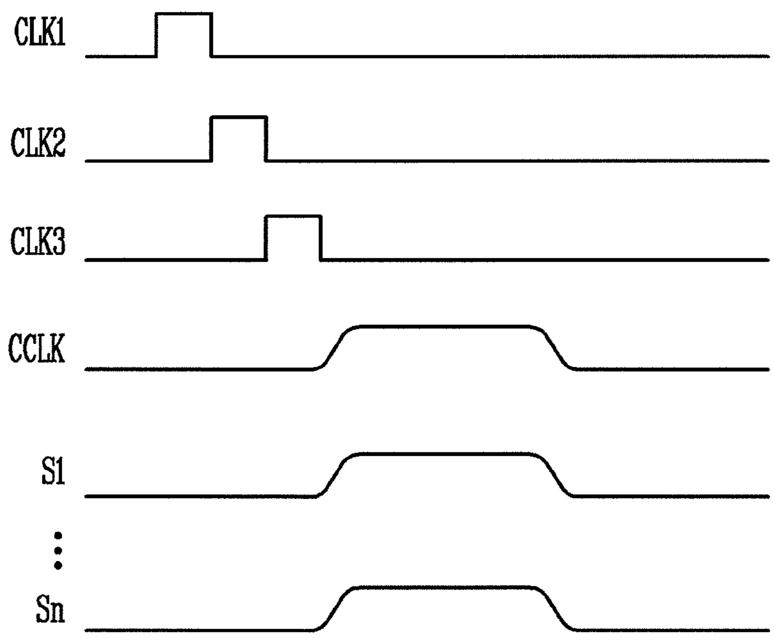
FIG. 5 is a waveform diagram illustrating a concurrent driving method of the stage circuit shown in FIG. 3.

FIG. 5 is a waveform diagram illustrating a concurrent driving method of the stage circuit shown in FIG. 3.

Referring to FIG. 5, the first to third clock signals CLK1 to CLK3 are progressively supplied. When the third clock signal CLK3 is supplied, the sixth transistor M6 included in the i-th stage is turned on. When the sixth transistor M6 is turned on, the voltage of the first power source VDD is supplied to the second node N2. When the voltage of the first power source VDD is supplied to the second node N2, the second transistor M2 is turned on.

Similarly, in a case when the first clock signal CLK1 is supplied, the second transistor M2 included in the (i+1)-th stage is turned on. In a case when the second clock signal CLK2 is supplied, the second transistor M2 included in the (i+2)-th stage is turned on. Thus, in a case when the first to third clock signals CLK1 to CLK3 are progressively supplied, the second transistor M2 included in each of the stages is set to be in a turned-on state.

Then, the common clock signal CCLK is supplied to the fourth input terminal 104. The common clock signal CCLK supplied to the fourth input terminal 104 is supplied to the output terminal 106 via the second transistor M2. That is, the common clock signal CCLK, i.e., the scan signal, is outputted to the output terminals 106 of all the stages.

Here, when the common clock signal CCLK is supplied to the fourth input terminal 104, the voltage at the second node N2 is increased corresponding to the common clock signal CCLK. Accordingly, the second transistor M2 can stably maintain the turned-on state. As described above, in an embodiment of the present invention, it is possible to progressively or concurrently (e.g., simultaneously) supply the scan signal to the scan lines S1 to Sn using the stage circuits.

Additionally, in a case when the fifth input terminal 105 receives an output signal of the previous stage, the fourth transistor M4 may be turned on. Although the fourth transistor M4 is turned on, the seventh transistor M7 maintains a turned-off state. Hence, the voltage at the second node N2 is stably maintained.

In order to ensure the stability of the operation, the scan signal is progressively outputted during at least one frame period as shown in FIG. 4, and then the scan signal is concurrently (e.g., simultaneously) supplied to the scan lines S1 to Sn as shown in FIG. 5. For example, when power is supplied to the organic light emitting display, the scan driver 10 performs a reset process of progressively outputting the scan signal as shown in FIG. 4, and then concurrently (e.g., simultaneously) or progressively supplies the scan signal to the scan lines S1 to Sn, corresponding to the driving method.

Figure 6:
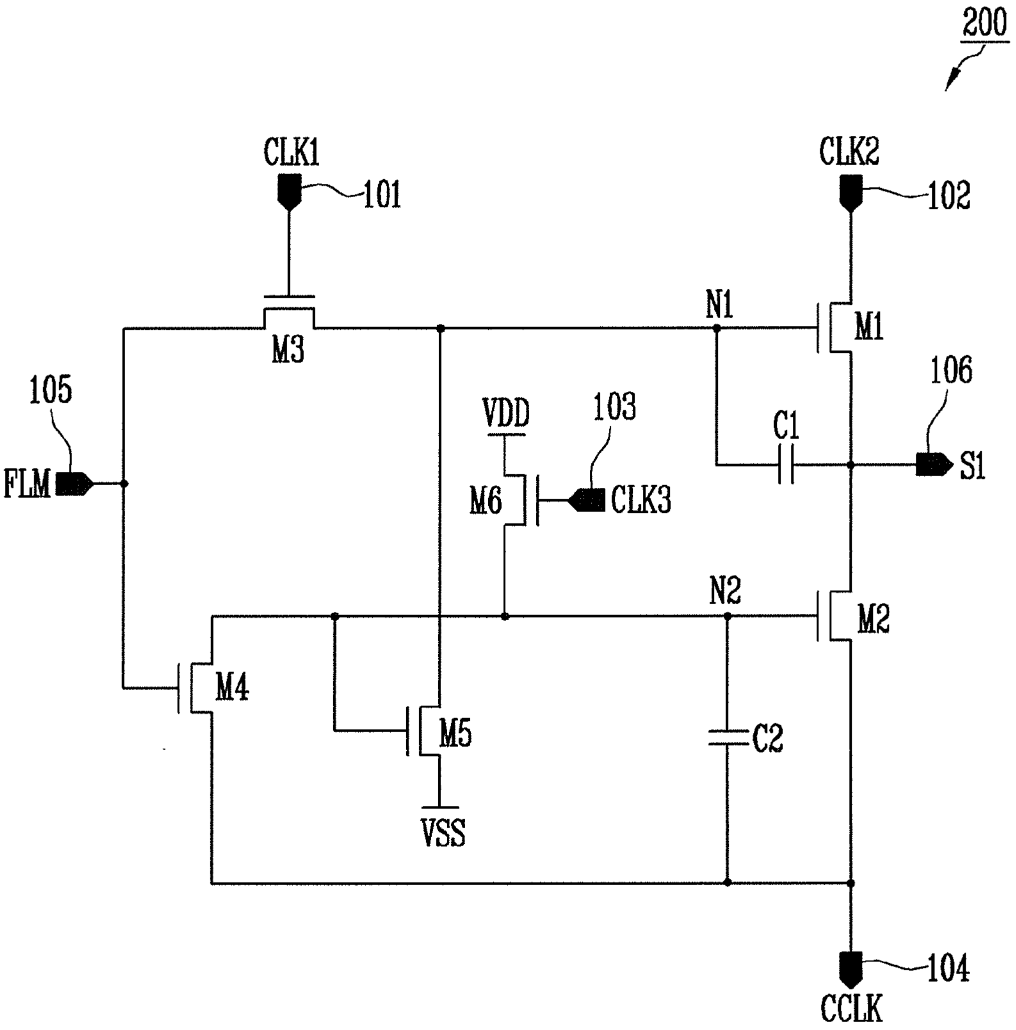
FIG. 6 is a circuit diagram schematically showing another embodiment of the stage shown in FIG. 2.

FIG. 6 is a circuit diagram schematically showing another embodiment of the stage shown in FIG. 2. In the description of FIG. 6, detailed descriptions of components identical to those of FIG. 3 will be omitted.

Referring to FIG. 6, the fourth transistor M4 of the stage 200 according to this embodiment is coupled between the fourth input terminal 104 and the second node N2. That is, in this embodiment, the seventh transistor M7 is removed from the configuration shown in FIG. 3, and a second electrode of the fourth transistor M4 is coupled to the fourth input terminal 104. The other components are identical to those shown in FIG. 3, and therefore, their detailed descriptions will be omitted.

The stage 200 according to this embodiment progressively or concurrently (e.g., simultaneously) supplies a scan signal to the scan lines S1 to Sn, corresponding to the driving methods shown in FIGS. 4 and 5.

When the scan signal is concurrently (e.g., simultaneously) supplied to the scan lines S1 to Sn, the common clock signal CCLK supplied to the fourth input terminal 104 and the output signal of the previous stage, supplied to the fifth input terminal 105, are set to have approximately the same voltage. Thus, the fourth transistor M4 can stably maintain a turned-off state even when the scan signal is concurrently (e.g., simultaneously) supplied to the scan lines S1 to Sn.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A stage circuit comprising:

a progressive driver comprising a first transistor coupled between a second input terminal and an output terminal of the stage circuit, a gate electrode of the first transistor being coupled to a first node; a third transistor coupled between the first node and a fifth input terminal of the stage circuit, a gate electrode of the third transistor being coupled to a first input terminal of the stage circuit; a fourth transistor coupled between a second node and a voltage supply terminal, a gate electrode of the fourth transistor being coupled to the fifth input terminal; a fifth transistor coupled between the first node and a second power source, a gate electrode of the fifth transistor being coupled to the second node; and a sixth transistor coupled between a first power source and the second node, a gate electrode of the sixth transistor being coupled to a third input terminal of the stage circuit; and a concurrent driver comprising a second transistor coupled between the output terminal and a fourth input terminal of the stage circuit, a gate electrode of the second transistor being coupled to the second node.

2. The stage circuit according to claim 1, further comprising:

a first capacitor coupled between the first node and the output terminal; and a second capacitor coupled between the second node and the fourth input terminal.

3. The stage circuit according to claim 1, wherein the voltage supply terminal is coupled to the fourth input terminal.

4. The stage circuit according to claim 1, wherein the voltage supply terminal is coupled to the second power source.

5. The stage circuit according to claim 4, further comprising a seventh transistor coupled between the second power source and the fourth transistor, a gate electrode of the seventh transistor being coupled to the first input terminal.

6. The stage circuit according to claim 1, wherein the first, second, and third input terminals are configured to receive clock signals having different phases, respectively.

7. The stage circuit according to claim 6, wherein the fifth input terminal is configured to receive a start signal or an output signal of a previous stage circuit in synchronization with the clock signal supplied to the first input terminal.

8. The stage circuit according to claim 6, wherein the clock signals are supplied to the respective first to third input terminals at least once, and a common clock signal is then supplied to the fourth input terminal during a period in which a scan signal is supplied by the concurrent driver.

9. The stage circuit according to claim 5, wherein the first power source is set to a voltage at which the first to seventh transistors are turned on, and the second power source is set to a voltage at which the first to seventh transistors are turned off.

10. A scan driver comprising stage circuits respectively coupled to scan lines for supplying a scan signal to the scan lines, wherein a stage circuit of the stage circuits comprises:

a progressive driver comprising a first transistor coupled between a second input terminal and an output terminal of the stage circuit, a gate electrode of the first transistor being coupled to a first node; a third transistor coupled between the first node and a fifth input terminal of the stage circuit, a gate electrode of the third transistor being coupled to a first input terminal of the stage circuit; a fourth transistor coupled between a second node and a voltage supply terminal, a gate electrode of the fourth transistor being coupled to the fifth input terminal; a fifth transistor coupled between the first node and a second power source, a gate electrode of the fifth transistor being coupled to the second node; and a sixth transistor coupled between a first power source and the second node, a gate electrode of the sixth transistor being coupled to a third input terminal of the stage circuit; and a concurrent driver comprising a second transistor coupled between the output terminal and a fourth input terminal of the stage circuit, a gate electrode of the second transistor being coupled to the second node.

11. The scan driver according to claim 10, further comprising:

a first capacitor coupled between the first node and the output terminal; and a second capacitor coupled between the second node and the fourth input terminal.

12. The scan driver according to claim 10, wherein the voltage supply terminal is coupled to the fourth input terminal.

13. The scan driver according to claim 10, wherein the voltage supply terminal is coupled to the second power source.

14. The scan driver according to claim 13, further comprising a seventh transistor coupled between the second power source and the fourth transistor, a gate electrode of the seventh transistor being coupled to the first input terminal.

15. The scan driver according to claim 10, wherein the first, second, and third input terminals are configured to receive clock signals having different phases, respectively.

16. The scan driver according to claim 15, wherein:

the first, second, and third input terminals included in an i-th stage circuit (where i is 1, 4, 7, . . . ) of the stage circuits are configured to receive first, second, and third clock signals, respectively;

the first, second, and third input terminals included in an (i+1)-th stage circuit of the stage circuits are configured to receive the second, third, and first clock signals, respectively; and the first, second, and third input terminals included in an (i+2)-th stage circuit of the stage circuits are configured to receive the third, first, and second clock signals, respectively.

17. The scan driver according to claim 16, wherein the first, second, and third clock signals are progressively supplied.

18. The scan driver according to claim 16, wherein the fifth input terminal is configured to receive a start signal or an output signal of a previous stage circuit in synchronization with the clock signal supplied to the first input terminal.

19. The scan driver according to claim 16, wherein the fourth terminals included in the i-th, (i+1)-th, and (i+2)-th stage circuits are configured to receive a common clock signal.

20. The scan driver according to claim 19, wherein the first, second, and third clock signals are supplied to the respective first to third input terminals at least once, and a common clock signal is then supplied to the fourth input terminal during a period in which a scan signal is supplied by the concurrent driver.

* * * * *